(12) United States Patent
Clews et al.

(10) Patent No.: US 6,893,578 B1
(45) Date of Patent: May 17, 2005

(54) SELECTIVE ETCHANT FOR OXIDE SACRIFICIAL MATERIAL IN SEMICONDUCTOR DEVICE FABRICATION

(75) Inventors: Peggy J. Clews, Tijeras, NM (US); Seethambal S. Mani, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 10/010,850

(22) Filed: Dec. 5, 2001

(51) Int. Cl.$^7$ ............................................. C03C 15/00
(52) U.S. Cl. ...................... 216/99; 216/102; 216/106; 216/107; 216/108; 216/109
(58) Field of Search ........................... 216/99, 102, 106, 216/107, 108, 109, 101; 438/756

(56) References Cited

U.S. PATENT DOCUMENTS

| | | | |
|---|---|---|---|
| 4,009,115 A | 2/1977 | Binns | 252/142 |
| 4,370,173 A | 1/1983 | Dollman | 134/3 |
| 4,959,105 A | 9/1990 | Neidiffer et al. | 134/3 |
| 5,824,601 A | 10/1998 | Dao | 438/713 |
| 5,851,928 A * | 12/1998 | Cripe et al. | 438/748 |
| 5,897,349 A * | 4/1999 | Agnello | 438/230 |
| 6,123,865 A * | 9/2000 | Lin et al. | 216/91 |
| 6,281,084 B1 * | 8/2001 | Akatsu et al. | 438/301 |
| 6,479,395 B1 * | 11/2002 | Smith et al. | 438/723 |
| 6,605,230 B1 * | 8/2003 | Liaw et al. | 216/104 |

OTHER PUBLICATIONS

Gennissen et al., "Sacrificial Oxide Etching Compatible with Aluminum Metallization", Proceedings of the 1997 International Conference on Solid–State Sensors and Actuators, Transducer '97, pp. 225–228, Jun. 16–19, 1997.*

Gennissen et al., "Sacrificial Oxide Etching Compatible with Aluminum Metallization", Proceedings of the 1997 International Conference on Solid–state Sensors and Aduators, Transducer '97, pp. 225–228, Jun. 16–19, 1997.*

J. Buhler, F.–P. Steiner and H. Baltes, "Silicon Dioxide Sacrificial Layer Etching in Surface Micromachining," *Journal of Micromechanics and Microengineering*, vol. 7, pp. R1–R13, 1997.

P.T.J. Gennissen and P.J. French, "Sacrificial Oxide Etching Compatible with Aluminum Metallization," *Proceedings of the 1997 International Conference on Solid–State Sensors and Actuators, Transducers '97*, pp. 225–228, 1997.

J.F.L. Goosen, B.P. van Drieenhuizen, P.J. French and R.F. Wolffenbuttel, "Problems of Sacrificial Etching in the Presence of Aluminum Interconnect," *Sensors and Actuators A*, vol. 62, pp. 692–697 (1997).

L. Archer and S.–A. Henry, "Removing Potash Polymer Residue from BEOL Structures Using Inorganic Chemicals," *Micro* (micromagazine.com), pp. 95–103, Jun. 2001.

"Reidel–de Haen Electronic Chemicals of Semiconductor Grade," (www.sigmaaldrich.com/saws.nsf/Pages/fl_new-products_sp3?OpenDocument) pp. 1–4, Nov. 28, 2001.

* cited by examiner

*Primary Examiner*—Nadine G. Norton
*Assistant Examiner*—Binh X. Tran
(74) *Attorney, Agent, or Firm*—John P. Hohimer

(57) ABSTRACT

An etching composition and method is disclosed for removing an oxide sacrificial material during manufacture of semiconductor devices including micromechanical, microelectromechanical or microfluidic devices. The etching composition and method are based on the combination of hydrofluoric acid (HF) and sulfuric acid ($H_2SO_4$). These acids can be used in the ratio of 1:3 to 3:1 HF:$H_2SO_4$ to remove all or part of the oxide sacrificial material while providing a high etch selectivity for non-oxide materials including polysilicon, silicon nitride and metals comprising aluminum. Both the HF and $H_2SO_4$ can be provided as "semiconductor grade" acids in concentrations of generally 40–50% by weight HF, and at least 90% by weight $H_2SO_4$.

7 Claims, 1 Drawing Sheet

SELECTIVE ETCHANT FOR OXIDE SACRIFICIAL MATERIAL IN SEMICONDUCTOR DEVICE FABRICATION

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to wet etching, and in particular to an etch composition and method for selectively removing an oxide sacrificial material during fabrication of semiconductor devices (e.g. micromechanical, microelectromechanical or microfluidic devices) which contain a metal layer comprising aluminum, without substantially damaging that metal layer. The metal layer can form a structural layer of the semiconductor device, or a bond pad.

BACKGROUND OF THE INVENTION

Among the most difficult steps in fabricating certain types of semiconductor devices such as micromechanical devices, microelectromechanical devices or microfluidic devices is the removal of an oxide sacrificial material which is used to build up the structure of the devices and which is then removed to complete the fabrication of the devices. The sacrificial material can be used, for example, to separate and precisely space layers or elements within the semiconductor device; can be patterned to form a mandrel or mold to define the shape of certain elements of the semiconductor device formed from deposited structural layers (e.g. polysilicon, silicon nitride, or metals); or can be used as a covering to protect certain elements (e.g. bond pads) during further processing steps.

The removal of the oxide sacrificial material generally requires the use of a selective etchant such as hydrofluoric acid (HF) in liquid or vapor form to dissolve away the oxide sacrificial material over a period of up to several hours or more. A high degree of selectivity is required by the etchant so that other layers in the device which are generally formed from polysilicon (i.e. polycrystalline silicon), silicon nitride, or metals are not substantially chemically attacked and damaged. Further information about the etching of oxide sacrificial materials can be found in an article by J. Buhler et al entitled "Silicon Dioxide Sacrificial Layer Etching in Surface Micromachining," (*Journal of Micromechanics and Microengineering*, vol. 7, pp; R1–R13, 1997).

Conventional etchants comprising HF at concentrations of about 50% by weight or less are generally unsuitable for etching oxide sacrificial materials in the presence of an exposed metal layer comprising aluminum since the aluminum is chemically attacked at an unacceptably high rate by hydronium ions present in the HF etchant. A carboxylic acid etching solution, as disclosed in U.S. Pat. No. 5,824,601 to Dao, has been developed to improve the etch selectivity to metals including aluminum. However, the HF content in this carboxylic acid etching solution is low (about 8%) so that the time required for removal of an oxide sacrificial material is excessive for many applications.

The present invention provides an etch composition and method that overcomes the difficulties of the prior art and provides a relatively high etch rate for an oxide sacrificial material while minimizing etching of other materials within a semiconductor device that comprise polysilicon, silicon nitride or metals.

The present invention further provides an etch composition and method that is compatible with high-purity semiconductor manufacturing operations.

These and other advantages of the present invention will become evident to those skilled in the art.

SUMMARY OF THE INVENTION

The present invention, which relates to a method for manufacturing a semiconductor device using an oxide sacrificial material, comprises the step of etching the oxide sacrificial material using an etching solution comprising a mixture of hydrofluoric acid (HF) and sulfuric acid ($H_2SO_4$). The semiconductor device being fabricated using the etching step of the present invention generally comprises a plurality of deposited and patterned layers which typically includes at least one polysilicon layer, and which can further include a metal layer comprising aluminum. The semiconductor device can comprise, for example, a micromechanical device, a microelectromechanical device, or a microfluidic device.

For compatibility with high-purity semiconductor manufacturing operations, the hydrofluoric acid preferably comprises a "semiconductor grade" hydrofluoric acid, and the sulfuric acid preferably comprises a "semiconductor grade" sulfuric acid. Those skilled in the art will understand that the term "semiconductor grade" refers to a chemical having a higher level of purity than that present in a "technical grade" chemical, and that "semiconductor grade" chemicals are preferred when fabricating semiconductor devices to improve the manufacturing yield and reliability (see e.g. W. J. Sievert, "Setting Standards—The Development of Standards in the Field of Electronic Chemicals," *Semiconductor Fabtech*, 13th edition, pp. 175–179, March 2001). The hydrofluoric acid concentration according to the present invention is generally in the range of 40–50% by weight HF; and the sulfuric acid concentration is generally at least 90% by weight $H_2SO_4$. The hydrofluoric acid and sulfuric acid in the etching solution can be provided in a ratio $HF:H_2SO_4$ that ranges from 1:3 to 3:1 or more, and preferably in the range of 1:1 to 3:1. These ratios in the range of 1:3 to 3:1 provide an etch selectivity for the oxide sacrificial material relative to the metal layer of greater than 100. Etching can be performed with the etching solution at a temperature anywhere in the range of 5–70° C.

The present invention further relates to an etch composition that is useful for removing an oxide sacrificial material from a semiconductor device during fabrication thereof, with the etch composition comprising a solution of hydrofluoric acid (HF) and sulfuric acid ($H_2SO_4$), and with the hydrofluoric acid being at least 40% by weight HF. The HF and $H_2SO_4$ are generally provided as "semiconductor grade" HF and $H_2SO_4$, with the HF having a concentration in the range 40–50% by weight HF, and with the $H_2SO_4$ generally having a concentration of at least 90% by weight $H_2SO_4$. The ratio of $HF:H_2SO_4$ in the etch composition solution can be in the range of 1:3 to 3:1. This etch composition of the present invention is useful for removing one or more layers of the oxide sacrificial material or portions thereof from semiconductor devices that additionally include at least one layer of polysilicon or silicon nitride. Such semiconductor devices, which can further include one or more metal layers comprising aluminum, can include micromechanical devices, microelectromechanical devices or microfluidic devices.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1A:
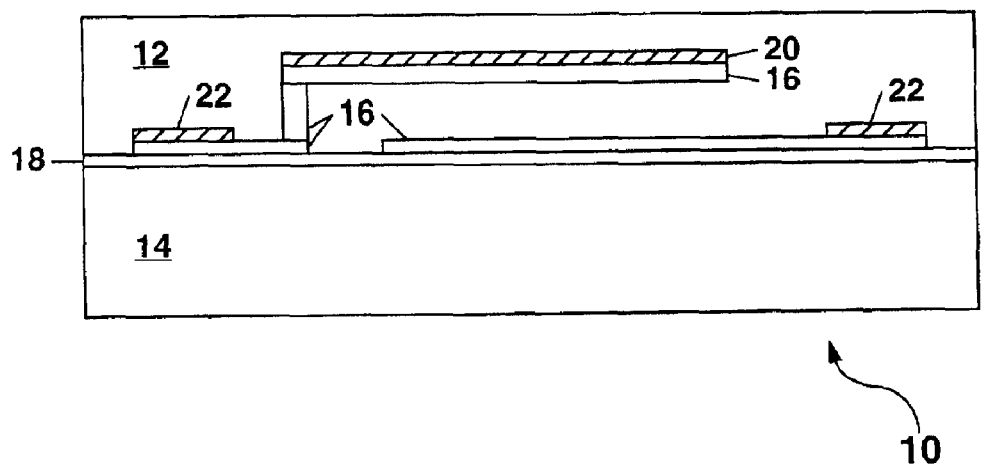
FIGS. 1A and 1B schematically illustrate in cross-section view a semiconductor device having a plurality of deposited and patterned layers before and after removal of an oxide sacrificial material, respectively.

The present invention provides an etching solution (also termed herein an etch composition) that is a mixture of hydrofluoric acid (HF) and sulfuric acid ($H_2SO_4$). This etching solution of the present invention is particularly useful for removing one or more layers of an oxide sacrificial material 12 comprising a silicon oxide (e.g. $SiO_2$) or silicate glass (e.g. TEOS) that has been used to build up the structure of a semiconductor device 10 (e.g. a micromechanical, microelectromechanical or microfluidic device) on a substrate 14. Such devices 10, which are schematically illustrated in the cross-section views of FIGS. 1A and 1B before and after removal of the oxide sacrificial material 12, respectively, are formed by depositing and patterning a plurality of material layers including layers of the oxide sacrificial material 12, and non-oxide layers comprising polysilicon 16, silicon nitride 18 and/or metals 20. A step for removing at least a portion of the oxide sacrificial material 12 by the etching solution of the present invention can be performed in order to free up one or more elements of the micromechanical or microelectromechanical device for movement, to form fluid channels within the microfluidic device, or to remove a portion of the oxide sacrificial material 12 covering metal bond pads 22 on the device.

Figure 1B:
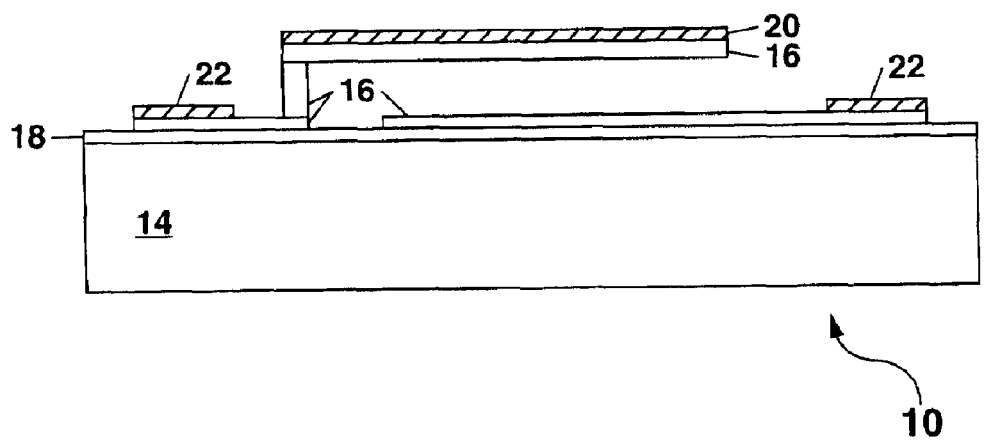

Removal of the oxide sacrificial material 12 is preferably accomplished using a selective etch composition that does not unduly etch away non-oxide layers of polysilicon, silicon nitride or metal that are needed to form the structure of the completed device 10 as shown in FIG. 1B. This necessitates a relatively high etch selectivity of the oxide sacrificial material relative to the polysilicon, silicon nitride and metal layers 16, 18 and 20, and any metal bond pads 22.

Hydrofluoric acid at high concentrations (e.g. 73% by weight) can provide a high etch selectivity of an oxide sacrificial material 12 relative to the polysilicon and silicon nitride and metal layers 16, 18 and 20, including metal layers 20 comprising aluminum. However, such high concentrations of HF are only currently available in a "technical grade" which contains an unacceptably high level of impurities for many semiconductor manufacturing operations. This high level of impurities in "technical grade" HF can attack polysilicon layers, thereby comprising the integrity and strength of the released structures and degrading the manufacturing yield and reliability of the semiconductor devices 10.

With "semiconductor grade" HF which contains fewer impurities and is therefore to be preferred for manufacturing semiconductor devices 10 according to the present invention, the maximum available HF concentration is presently limited to 50% by weight HF, with the remainder being water. An increased hydronium ion ($H_3O^+$) concentration in "semiconductor grade" HF as compared to the 73% "technical grade" HF reduces the etch selectivity of the oxide sacrificial material to aluminum-containing layers in the semiconductor device due to the chemical reaction:

$$2Al + 6H_3O^+ \rightarrow 2Al^{3+} + 3H_2(g) + 6H_2O$$

This results in an unacceptably high etch rate for the aluminum-containing layers (e.g. shown as 20 and 22 in the example of FIGS. 1A and 1B).

According to the present invention, the addition of sulfuric acid to the hydrofluoric acid has been found to be advantageous in reducing the hydronium ion concentration in the resultant etching solution, thereby allowing the use of "semiconductor grade" HF in concentrations of 40–50% by weight HF while providing an increased etch selectivity for aluminum-containing layers as compared to similar etching solutions without sulfuric acid. Additionally, sulfuric acid is available in "semiconductor grade" quality thereby minimizing any potential damage to the semiconductor devices from impurities therein. Generally, the sulfuric acid that is added to the hydrofluoric acid to form the etch composition of the present invention comprises at least 90% by weight $H_2SO_4$, and preferably 95–98% by weight $H_2SO_4$.

Mixing of the HF and $H_2SO_4$ initially at room temperature is exothermic resulting in a temperature rise immediately after mixing which depends on the ratio of the HF to $H_2SO_4$ as shown in Table 1. After mixing, the etching solution cools rapidly

TABLE 1

| HF:$H_2SO_4$ Ratio | Temperature After Mixing (° C.) |
|---|---|
| 10:1 | 35 |
| 3:1 | 54 |
| 2:1 | 58–59 |
| 1.5:1 | 63 |
| 1:1 | 66–68 |
| 1:3 | 60 |
| 1:10 | 45 | from evaporation, and gives off a fog of gas if not covered. The etch composition of the present invention can be used at any temperature within the range of 5–70° C. A container holding the etch composition can be heated or cooled, as needed, to maintain the etch composition at a particular temperature within the above range.

To evaluate various compositions of the etching solution of the present invention, measurements of the etch rates were made for a densified undoped TEOS oxide sacrificial material layer 12, for a low-stress silicon nitride layer 18, and for metal layers 20 comprising an aluminum-copper alloy (i.e. Al with 0.5% Cu) and titanium nitride (TiN).

Measurements of the etch rates for the TEOS oxide sacrificial material were made using a structure having a 2 μm thick layer 12 of the TEOS oxide sacrificial material blanket deposited on a silicon substrate 14 from the decomposition of tetraethylortho silicate by low-pressure chemical vapor deposition (LPCVD) at about 750° C., and densified by a high temperature processing step. A 2 μm layer 16 of polysilicon deposited by LPCVD at a temperature of 580° C. covered the TEOS layer 12, with the polysilicon layer 16 being patterned by a photolithographically defined mask and reactive ion etching to form a plurality of parallel channels through the polysilicon layer to expose portions of the underlying TEOS layer 12.

A plurality of substrate pieces containing the patterned channels for exposing the TEOS layer were immersed in each particular etch composition comprising 49% by weight HF and 98% by weight $H_2SO_4$ in various ratios in the range of 1:10 $HF:H_2SO_4$ up to 10:1 $HF:H_2SO_4$. During these etching measurements, each etching solution was maintained at about 20° C. without agitation. At periodic time intervals, one of the substrate pieces containing the exposed TEOS layer was removed from each etch solution, rinsed in water and examined to determine the extent of lateral etching of the TEOS layer 12 underneath the polysilicon layer 16. The etching was terminated when the TEOS layer 12 was laterally etched to undercut the TEOS oxide sacrificial material by a distance of 50 μm underneath the polysilicon layer 16. This 50 μm extent of lateral etching is a typical etching requirement for many types of micromechanical, microelectromechanical or microfluidic devices 10.

The time required to laterally undercut the TEOS layer 12 by 50 μm varied from 33 minutes to 714 minutes depending upon the $HF:H_2SO_4$ ratio in each etching solution. The measured etching time for a particular etch composition was then used to calculate an average etch rate for the TEOS oxide sacrificial material for that etch composition. During undercutting of the TEOS layer 12, the polysilicon layer 16 was not substantially etched by the $HF:H_2SO_4$ solution so that no measurements of the etch rate of polysilicon were made. Etch rate measurements were made for various ratios of $HF:H_2SO_4$ with the results being shown in Table 2 for the various oxide and non-oxide materials studied.

TABLE 2

| $HF:H_2SO_4$ Ratio | TEOS Oxide Sacrificial Material Etch Rate (μm/minute) | Low-Stress Silicon Nitride Etch Rate (Å/minute) | Al—Cu Alloy Etch Rate (Å/minute) | TiN Etch Rate (Å/minute) |
|---|---|---|---|---|
| 10:1 | 1.5 | 38 | 230 | 0.70 |
| 3:1 | 1.4 | 27 | 94 | 0.51 |
| 2:1 | 1.2 | 21 | 39 | 0.53 |
| 1.5:1 | 0.97 | 17 | 16 | 0.38 |
| 1:1 | 0.57 | 12 | 5.6 | 0.24 |
| 1:3 | 0.07 | 2.5 | 0.20 | 0.16 |
| 1:10 | Not measured | 0.07 | 0.04 | 0.00 |

To measure the etch rates for the low-stress silicon nitride layer 18 and for the Al—Cu and TiN metal layers 20, layers of these materials were blanket deposited over a silicon substrate 14, or over an oxide layer on the silicon substrate 14. The metal layers 20 were deposited by sputtering; and the low-stress silicon nitride layer 18 was deposited by LPCVD at about 850° C. Substrate pieces containing the silicon nitride and metal layers, 18 and 20, were placed into the etching solution at the same time as the substrate pieces containing the TEOS layer 12, and were removed once etching of the TEOS layer 12 was complete (i.e. after laterally etching for 50 μm), or after a predetermined time interval in the case of the 1:10 $HF:H_2SO_4$ etching solution. The thickness of the silicon nitride layer 18 was measured before and after etching using ellipsometry in order to determine the etching rate. Sheet resistance of the Al—Cu and TiN metal layers 20 were performed before and after etching using a four-point probe in order to determine the etch rates for these metal layers.

Table 3 shows the etch selectivity of the silicon nitride layers and metal layers, 18 and 20, relative to the TEOS oxide sacrificial layer 12 calculated from the data in Table 2. The etch selectivity is defined herein as the etch rate of the oxide sacrificial material divided by the etch rate of a non-oxide material (e.g. a silicon nitride or metal layer).

TABLE 3

| $HF:H_2SO_4$ Ratio | Al—Cu Alloy | TiN | Low-Stress Silicon Nitride |
|---|---|---|---|
| 10:1 | 65 | 21000 | 400 |
| 3:1 | 150 | 27000 | 530 |
| 2:1 | 320 | 27000 | 560 |
| 1.5:1 | 610 | 39000 | 570 |
| 1:1 | 1100 | 26000 | 470 |
| 1:3 | 3500 | 4300 | 280 |

Table 3 shows that etch compositions having a ratio of $HF:H_2SO_4$ in the range of 1:3 to 3:1 provide an etch selectivity for the TEOS oxide sacrificial material relative to the metal layer 20 containing aluminum in excess of 100. These etch compositions are particularly useful for etching semiconductor devices 10 containing one or more layers 20 comprising aluminum. This includes semiconductor devices having aluminum bond pads 22, aluminum interconnect layers, aluminum structural layers, or aluminum reflective mirror layers. In Table 3, the TiN metal layer 20 is not substantially etched for any of the etch compositions listed, and can be used, for example, as a protection layer over portions of the semiconductor device 10 during fabrication thereof. The low-stress silicon nitride layer 18 as shown in Table 3 also exhibits a high etch selectivity of about 500 for $HF:H_2SO_4$ ratios in the range of 1:1 to 3:1.

For etching a particular semiconductor device 10 incorporating one or more of the layers in Tables 2 and 3, the data provided in Tables 2 and 3 can be used to select a particular etch composition to provide a desired etching rate for the TEOS oxide sacrificial material while maintaining a high etch selectivity for other non-oxide layers within the device (e.g. the layers 16, 18 and 20). For example, when etching a micromechanical, microelectromechanical or microfluidic device 10 incorporating one or more TEOS oxide sacrificial layers 12 in addition to polysilicon, silicon nitride and metal layers, it is generally preferable to use an etch composition comprising a ratio of $HF:H_2SO_4$ in the range of 1:1 to 3:1 and most preferably about 1.5:1 to 2:1 since this provides a relatively high etch rate for removing the TEOS oxide sacrificial material while at the same time providing good etch selectivities for the silicon nitride and metal layers. Those skilled in the art will understand that the etch composition of the present invention is applicable to other types of oxide sacrificial materials known to the art and to other types of metals used in forming semiconductor devices. Those skilled in the art will understand that the measurements described herein with reference to Tables 2 and 3 can be repeated for each particular type of oxide sacrificial material to determine the etch rates and etch selectivity for the oxide and non-oxide materials.

Furthermore, it is intended that the etch composition of the present invention can include HF with concentrations exceeding 50% by weight HF Presently, only "technical grade" HF is commercially available with concentrations exceeding 50% by weight HF. For non-critical applications, such "technical grade" HF with a concentration exceeding 50% by weight HF can be used in combination with "technical grade" or "semiconductor grade" $H_2SO_4$ according to the present invention. Alternately, when "semiconductor grade" HF becomes available with a concentration exceeding 50% by weight HF, this will generally be preferred over the "technical grade" HF, expecially for semiconductor device manufacture. For other HF concentrations, the measurements described herein with reference to Tables 2 and 3 can be repeated to determine the etch rates for the oxide and non-oxide materials and the etch selectivity in order to select a particular etch composition. In general, to provide a particular level of etch selectivity as shown in Table 3, a smaller amount of $H_2SO_4$ relative to HF needs to be provided in the etching solution according to the present invention as the HF concentration is increased above 49%, and a larger amount of $H_2SO_4$ relative to HF should be used in the etching solution as the HF concentration is reduced below 49%. Also, the etch rate for the oxide sacrificial material will vary in proportion to the amount of HF in the etch solution.

Once etching of a particular semiconductor device 10 and removal of all or a portion of the oxide sacrificial material therefrom is completed using the etch composition of the present invention, the etching solution can be removed from the semiconductor device 10 using a rinsing step, for example, using deionized water in a flow-through rinse tank. For semiconductor devices containing one or more layers comprising aluminum, the rinsing step is preferably performed rapidly to minimize contact of the aluminum layers with the diluted etching solution which can further etch the aluminum layers due to the increased hydronium ion concentration. Additionally, careful attention should be devoted to the drying of micromechanical or microelectromechanical devices 10 to prevent the possibility of stiction (i.e. adhesion) of moveable elements therein. In some instances, it may be preferable to add a surfactant to the etching solution to aid in the rinsing and drying process to help prevent stiction. The surfactant can be added immediately prior to the rinsing step to prevent degradation of the surfactant by the strong acid etch composition of the present invention.

Other applications and variations of the present invention will become evident to those skilled in the art. The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A method for manufacturing a semiconductor device using a plurality of deposited and patterned layers of polysilicon, an oxide sacrificial material, and an exposed metal layer including aluminum comprising the step of etching the oxide sacrificial material by immersing the semiconductor device into an etching solution comprising hydrofluoric acid (HF) and sulfuric acid ($H_2SO_4$) in a ratio HF:$H_2SO_4$ ranging from 1:1 to 3:1 while retaining the patterned layers of polysilicon and the exposed metal layer including aluminum.

2. The method of claim 1 wherein the etching solution has an etch selectivity for the oxide sacrificial material relative to the exposed metal layer including aluminum of greater than 100.

3. The method of claim 1 wherein the semiconductor device comprises a micromechanical device, a microelectromechanical device or a microfluidic device.

4. The method of claim 1 wherein the step of etching the oxide sacrificial material is performed with the etching solution at a temperature in the range of 5–70° C.

5. The method of claim 1 wherein the hydrofluoric acid comprises a "semiconductor grade" hydrofluoric acid, and the sulfuric acid comprises a "semiconductor grade" sulfuric acid.

6. The method of claim 1 wherein the hydrofluoric acid comprises at least 40–50% by weight HF.

7. The method of claim 1 wherein the sulfuric acid comprises at least 90% by weight $H_2SO_4$.

* * * * *